United States Patent
Ren et al.

(10) Patent No.: US 12,243,952 B2
(45) Date of Patent: Mar. 4, 2025

(54) DOUBLE-SIDED PASSIVATED CONTACT CELL AND PREPARATION METHOD THEREOF

(71) Applicant: CHANGZHOU SHICHUANG ENERGY CO., LTD, Suzhou (CN)

(72) Inventors: Changrui Ren, Suzhou (CN); Songbo Yang, Henan (CN); Jianwen Dong, Suzhou (CN); Liming Fu, Zhejiang (CN)

(73) Assignee: CHANGZHOU SHICHUANG ENERGY CO., LTD, Jiangsu (CN)

( * ) Notice: Subject to any disclaimer, the term of this patent is extended or adjusted under 35 U.S.C. 154(b) by 0 days.

(21) Appl. No.: 18/711,116

(22) PCT Filed: Sep. 15, 2022

(86) PCT No.: PCT/CN2022/118909
§ 371 (c)(1),
(2) Date: May 17, 2024

(87) PCT Pub. No.: WO2023/087879
PCT Pub. Date: May 25, 2023

(65) Prior Publication Data
US 2025/0015221 A1      Jan. 9, 2025

(30) Foreign Application Priority Data

Nov. 19, 2021   (CN) .......................... 202111374547.4

(51) Int. Cl.
| | | |
|---|---|---|
| H01L 31/18 | (2006.01) | |
| H01L 31/0216 | (2014.01) | |
| H01L 31/0236 | (2006.01) | |
| H01L 31/0288 | (2006.01) | |
| H01L 31/0368 | (2006.01) | |

(52) U.S. Cl.
CPC ...... *H01L 31/182* (2013.01); *H01L 31/02167* (2013.01); *H01L 31/02366* (2013.01); *H01L 31/0288* (2013.01); *H01L 31/03682* (2013.01)

(58) Field of Classification Search
CPC ............. H01L 31/182; H01L 31/02167; H01L 31/02366; H01L 31/0288; H01L 31/03682
See application file for complete search history.

(56) References Cited

U.S. PATENT DOCUMENTS

| | | | |
|---|---|---|---|
| 11,387,376 B2 * | 7/2022 | Yang .................. | H01L 31/0682 |
| 2009/0020154 A1 * | 1/2009 | Sheng ............... | H01L 31/03685 |
| | | | 438/96 |
| 2011/0108100 A1 | 5/2011 | Yu et al. | |
| 2011/0272010 A1 | 11/2011 | Abou-Kandil et al. | |
| 2012/0012167 A1 | 1/2012 | Abou-Kandil et al. | |

FOREIGN PATENT DOCUMENTS

| | | |
|---|---|---|
| CN | 102194897 | 9/2011 |
| CN | 103035757 | 4/2013 |
| CN | 108807565 | 11/2018 |
| CN | 109216498 | 1/2019 |
| CN | 208806263 | 4/2019 |
| CN | 109786476 | 5/2019 |
| CN | 111416017 | 7/2020 |
| CN | 111477720 | 7/2020 |
| CN | 111628052 | 9/2020 |
| CN | 111668095 | 9/2020 |
| CN | 112164728 | 1/2021 |
| CN | 113345969 | 9/2021 |
| CN | 113471321 | 10/2021 |
| CN | 113594295 | 11/2021 |
| CN | 214753785 | 11/2021 |
| CN | 114050190 | 2/2022 |
| DE | 102006046726 | 4/2008 |

OTHER PUBLICATIONS

Cai, Hongkun et al., "Study on the Properties of p-type μc-SiC:H Thin Film and Application on Solar Cells on Flexible Substrate," Acta Energiae Solaris Sinica, vol. 33, No. 11, Nov. 2012, pp. 1841-1844.
Duy Phong Pham et al., "Innovative passivating contact using quantum well at poly-Si/c-Si interface for crystalline silicon solar cells," Chemical Engineering Journal, vol. 423, 130239, Nov. 2021, pp. 1-7.
Wang, Li et al., "Study of the contact property between BZO and p-a-SiC in amorphous silicon solar cell," Acta Phys. Sin., vol. 62, No. 5, 058801, Mar. 2013, pp. 1-6.
"International Search Report (Form PCT/ISA/210) of PCT/CN2022/118909," mailed on Dec. 20, 2022, with English translation thereof, pp. 1-6.

* cited by examiner

Primary Examiner — Earl N Taylor
(74) Attorney, Agent, or Firm — JCIPRNET

(57) ABSTRACT

The present disclosure provides a double-sided passivated contact cell, where a front side and a rear side of the double-sided passivated contact cell each are provided with a tunnel layer, a doped polysilicon layer, and a passivation layer sequentially from an inside to an outside; and for the doped polysilicon layer at the front side and the doped polysilicon layer at the rear side, one of the doped polysilicon layer at the front side and the doped polysilicon layer at the rear side is a boron and carbon co-doped polysilicon layer, and the other of the doped polysilicon layer at the front side and the doped polysilicon layer at the rear side is a phosphorus and carbon co-doped polysilicon layer. The present disclosure further provides a preparation method of the double-sided passivated contact cell.

6 Claims, No Drawings

DOUBLE-SIDED PASSIVATED CONTACT CELL AND PREPARATION METHOD THEREOF

CROSS-REFERENCE TO RELATED APPLICATION

This application is a 371 of international application of PCT application serial no. PCT/CN2022/118909, filed on Sep. 15, 2022, which claims the priority benefit of China application no. 202111374547.4, filed on Nov. 19, 2021. The entirety of each of the above mentioned patent applications is hereby incorporated by reference herein and made a part of this specification.

TECHNICAL FIELD

The present disclosure relates to the field of photovoltaics, and in particular to a double-sided passivated contact cell and a preparation method thereof.

BACKGROUND

The tunnel oxide passivated contact (TOPCon) is a passivated structure for crystalline silicon solar cells, and consists of an ultra-thin silicon oxide layer and a heavily doped polysilicon layer. The tunnel oxide passivated contact is mainly used to passivate a rear side of a solar cell, and can realize excellent surface passivation and carrier-selective collection. However, at present, a metal semiconductor contact is still used at a front side of such a solar cell. The recombination loss at the metal semiconductor contact restricts further improvements to the efficiency of the solar cell. In order to further improve the conversion efficiency of the solar cell, the passivated contact structure is also to be used at the front side of the solar cell. However, the front side of the solar cell not only needs to have the excellent passivation capability, but also needs to have the good optical transmittance and to avoid the efficiency loss due to parasitic absorption.

SUMMARY

Technical Problems

Solutions for Solving the Technical Problems

Technical Solutions

An objective of the present disclosure is to provide a double-sided passivated contact cell and a preparation method thereof. Through co-doping with elements to modify the polysilicon layer, the band gap of the polysilicon layer is increased. While ensuring passivation performance, the present disclosure improves light transmittance of the passivation layer, and yields a higher current.

To achieve the above-mentioned objective, the present disclosure provides a double-sided passivated contact cell, where a front side and a rear side of the double-sided passivated contact cell each are provided with a tunnel layer, a doped polysilicon layer, and a passivation layer sequentially from an inside to an outside; and for the doped polysilicon layer at the front side and the doped polysilicon layer at the rear side, one of the doped polysilicon layer at the front side and the doped polysilicon layer at the rear side is a boron and carbon co-doped polysilicon layer, and the other of the doped polysilicon layer at the front side and the doped polysilicon layer at the rear side is a phosphorus and carbon co-doped polysilicon layer.

Preferably, the tunnel layer is an ultra-thin oxide layer.
Preferably, the ultra-thin oxide layer is an aluminum oxide layer or a silicon dioxide layer.
Preferably, the ultra-thin oxide layer has a thickness of 0.5 nm to 2.5 nm (preferably 1 nm to 2 nm).
Preferably, a content of carbon doped in the doped polysilicon layer is 1% to 5% (preferably 3% to 4%).
Preferably, the passivation layer is a SiNx layer.

The present disclosure further provides a preparation method of the double-sided passivated contact cell, including the following steps: after surface texturing on a silicon wafer, preparing the tunnel layer at each of a front side and a rear side of the silicon wafer; then preparing a carbon doped polysilicon layer at each of the front side and the rear side of the silicon wafer; then performing boron doping on one of the carbon doped polysilicon layer at the front side and the carbon doped polysilicon layer at the rear side, and performing phosphorous doping on the other of the carbon doped polysilicon layer at the front side and the carbon doped polysilicon layer at the rear side; then preparing the passivation layer at each of the front side and the rear side of the silicon wafer; and then printing an electrode at each of the front side and the rear side of the silicon wafer.

Preferably, the carbon doped polysilicon layer is prepared by plasma enhanced chemical vapor deposition (PECVD) or low pressure chemical vapor deposition (LPCVD).

Preferably, methane ($CH_4$) is used as a carbon source for carbon doping to prepare the carbon doped polysilicon layer.

Preferably, the silicon wafer is an N-type silicon wafer; the boron doping is performed on the carbon doped polysilicon layer at the front side; the phosphorous doping is performed on the carbon doped polysilicon layer at the rear side; and the double-sided passivated contact cell prepared is an N-type double-sided passivated contact cell.

Beneficial Effects of the Present Disclosure
Beneficial Effects

The present disclosure has the following advantages and beneficial effects. According to the double-sided passivated contact cell and the preparation method thereof provided by the present disclosure, through co-doping with elements to modify the polysilicon layer, the band gap of the polysilicon layer is increased. While ensuring passivation performance, the present disclosure improves light transmittance of the passivation layer, and yields a higher current.

With the double-sided passivated contact structure including the co-doped passivation layer and tunnel layer, the present disclosure can greatly reduce carrier recombination on the surface of the cell, and increase an open-circuit voltage of the cell. Using the $CH_4$ as the carbon source, a content of H in the passivation interface can further be increased to improve the passivation effect, and a maximum implied open-circuit voltage (Ivoc) can be up to 750 mv. In addition, the carbon doping is performed to increase the band gap of the polysilicon layer to obtain a wide-band gap modified polysilicon. The wide-band gap modified polysilicon is used as a passivation material at the front side and the rear side to reduce the loss from infrared parasitic absorption, increase the cell current, and thereby greatly improve the solar cell efficiency.

In the present disclosure, in order to prevent the ultra-thin oxide layer from being too thin or too thick, the thickness of the ultra-thin oxide layer is controlled at 0.5 nm to 2.5 nm, and preferably at 1 nm to 2 nm. If the ultra-thin oxide layer is too thin, the passivation effect will be affected. If the ultra-thin oxide layer is too thick, the tunneling effect will be affected to impact the passivation effect.

In the present disclosure, in order to prevent the content of carbon doped from being too low or too high, the content of carbon doped in the polysilicon layer is controlled at 1% to 5%, and preferably at 3% to 4%. If the content of carbon doped is too low, the band gap of the polysilicon layer is increased little to make little improvements to the passivation and the current. If the content of carbon doped is too high, the contact resistance is affected to reduce the fill factor (FF).

In the present disclosure, the carbon doping can be performed by the PECVD or the LPCVD, and the methane ($CH_4$) is used as the carbon source, such that a high-temperature slurry can be printed subsequently, or indium-tin-oxide (ITO) and a low-temperature slurry can be used subsequently, thereby reducing the lateral resistance and improving the FF.

DETAILED DESCRIPTION OF THE EMBODIMENTS

Best Implementations of the Present Disclosure

The specific implementations of the present disclosure will be further described below in conjunction with the embodiments. The following embodiments are only used for describing the technical solutions of the present disclosure more clearly, and are not intended to limit the protection scope of the present disclosure.

The present disclosure provides an N-type double-sided passivated contact cell. A front side and a rear side of the N-type double-sided passivated contact cell each are provided with a tunnel layer, a doped polysilicon layer, and a passivation layer sequentially from an inside to an outside.

The tunnel layer is an ultra-thin oxide layer. The ultra-thin oxide layer may be an aluminum oxide layer or a silicon dioxide layer. The ultra-thin oxide layer has a thickness of 0.5 nm to 2.5 nm (preferably 1 nm to 2 nm).

A content of carbon doped in the doped polysilicon layer is 1% to 5% (preferably 3% to 4%).

The doped polysilicon layer at the front side is a boron and carbon co-doped polysilicon layer.

The doped polysilicon layer at the rear side is a phosphorus and carbon co-doped polysilicon layer.

The passivation layer is a SiNx layer.

The present disclosure further provides a preparation method of the N-type double-sided passivated contact cell, including the following steps. After surface texturing on an N-type silicon wafer, the tunnel layer is prepared at each of a front side and a rear side of the silicon wafer. A carbon doped polysilicon layer is prepared at each of the front side and the rear side of the silicon wafer. Boron doping is performed on the carbon doped polysilicon layer at the front side, and phosphorous doping is performed on the carbon doped polysilicon layer at the rear side. The passivation layer is prepared at each of the front side and the rear side of the silicon wafer. An electrode is printed at each of the front side and the rear side of the silicon wafer.

More specifically, the carbon doped polysilicon layer may be prepared by PECVD or LPCVD. Methane ($CH_4$) may be used as a carbon source for carbon doping to prepare the carbon doped polysilicon layer.

Specific examples of the present disclosure are as follows.

Example 1

After surface texturing on an N-type silicon wafer, a silicon oxide layer having a thickness of 1.2 nm was prepared at each of a front side and a rear side of the silicon wafer to serve as a tunnel layer. A carbon doped polysilicon layer was prepared at each of the front side and the rear side of the silicon wafer. A content of carbon doped in the polysilicon layer was 1%. Boron doping was performed on the polysilicon layer at the front side. Phosphorous doping was performed on the polysilicon layer at the rear side. A SiNx layer was prepared at each of the front side and the rear side of the silicon wafer to serve as a passivation layer. An electrode was printed at each of the front side and the rear side of the silicon wafer, thereby obtaining an N-type double-sided passivated contact cell.

Example 2

After surface texturing on an N-type silicon wafer, a silicon oxide layer having a thickness of 1.2 nm was prepared at each of a front side and a rear side of the silicon wafer to serve as a tunnel layer. A carbon doped polysilicon layer was prepared at each of the front side and the rear side of the silicon wafer. A content of carbon doped in the polysilicon layer was 3%. Boron doping was performed on the polysilicon layer at the front side. Phosphorous doping was performed on the polysilicon layer at the rear side. A SiNx layer was prepared at each of the front side and the rear side of the silicon wafer to serve as a passivation layer. An electrode was printed at each of the front side and the rear side of the silicon wafer, thereby obtaining an N-type double-sided passivated contact cell.

Example 3

After surface texturing on an N-type silicon wafer, a silicon oxide layer having a thickness of 1.2 nm was prepared at each of a front side and a rear side of the silicon wafer to serve as a tunnel layer. A carbon doped polysilicon layer was prepared at each of the front side and the rear side of the silicon wafer. A content of carbon doped in the polysilicon layer was 10%. Boron doping was performed on the polysilicon layer at the front side. Phosphorous doping was performed on the polysilicon layer at the rear side. A SiNx layer was prepared at each of the front side and the rear side of the silicon wafer to serve as a passivation layer. An electrode was printed at each of the front side and the rear side of the silicon wafer, thereby obtaining an N-type double-sided passivated contact cell.

Comparative Example 1

After surface texturing on an N-type silicon wafer, boron doping was performed at a front side of the silicon wafer. A silicon oxide layer having a thickness of 1.2 nm was prepared at a rear side of the silicon wafer to serve as a tunnel layer. A polysilicon layer was deposited on the silicon oxide layer. Phosphorous doping was performed on the polysilicon layer at the rear side. A SiNx layer was prepared at each of the front side and the rear side of the silicon wafer to serve as a passivation layer. An electrode was printed at each of the front side and the rear side of the silicon wafer, thereby obtaining an N-type double-sided passivated contact cell.

A performance test is performed on the N-type double-sided passivated contact cells prepared in the examples and in Comparative Example 1. Performance data of each example is compared with performance data of Comparative Example 1. With the performance data of Comparative Example 1 as a comparison base, differences between the performance data of each example and the performance data of Comparative Example 1 are shown in a table below.

|  | Voc (mV) | Short-circuit current density (Jsc) (mA/cm2) | FF (%) | Energy conversion efficiency (η) (%) |
|---|---|---|---|---|
| Comparative Example 1 | — | — | — | — |
| Example 1 | 6 | −0.3 | 0.2 | 0.1 |
| Example 2 | 7 | 1.1 | 0.1 | 0.4 |
| Example 3 | 3 | 1.5 | −1.1 | 0.1 |

As can be seen from the above comparison:

In comparison with Comparative Example 1, the tunnel oxide layer and the boron and carbon co-doped polysilicon layer superimposed thereon are deposited at the front side of the silicon wafer to serve as a passivation layer, and the content of carbon doped is 1% in Example 1. With the tunnel oxide layer and the boron and carbon co-doped polysilicon layer superimposed thereon which are deposited at the front side, both the open-circuit voltage and the fill factor can be effectively improved. However, due to the lower content of carbon doped, the current density has a large loss, and the overall efficiency of the cell is not improved obviously.

In comparison with Comparative Example 1, the tunnel oxide layer and the boron and carbon co-doped polysilicon layer superimposed thereon are deposited at the front side of the silicon wafer to serve as a passivation layer, and the content of carbon doped is 3% in Example 2. With the tunnel oxide layer and the boron and carbon co-doped polysilicon layer superimposed thereon which are deposited at the front side, the open-circuit voltage can be effectively improved. With the appropriate content of carbon doped, the current density is improved, and the efficiency of the cell is improved greatly.

In comparison with Comparative Example 1, the tunnel oxide layer and the boron and carbon co-doped polysilicon layer superimposed thereon are deposited at the front side of the silicon wafer to serve as a passivation layer, and the content of carbon doped is 10% in Example 3. With the tunnel oxide layer and the boron and carbon co-doped polysilicon layer superimposed thereon which are deposited at the front side, both the open-circuit voltage and the current density can be effectively improved. However, due to the too high content of carbon doped, the lateral resistance is increased, and the FF is reduced greatly, such that the efficiency of the cell is not improved obviously.

In conclusion, compared with Comparative Example 1, the present disclosure creatively prepares the tunnel oxide layer and the boron and carbon co-doped polysilicon layer superimposed thereon at the front side of the silicon wafer to serve as a passivation layer, and performs the carbon doping on the phosphorus doped polysilicon layer at the rear side of the silicon wafer for modification. The tunnel oxide layer and the boron and carbon co-doped polysilicon layer superimposed thereon at the front side can effectively passivate a defect in a contact region, thereby greatly improving the Voc and the FF. Meanwhile, the carbon doping also reduces the light absorption of the polysilicon layer, thereby increasing the current, and greatly improving the efficiency of the cell.

The above description is only preferred implementations of the present disclosure. It should be noted that those skilled in the art can make several improvements and modifications without departing from the technical principles of the present disclosure, and these improvements and modifications should also be construed as falling within the protection scope of the present disclosure.

What is claimed is:

1. A preparation method of a double-sided passivated contact cell, comprising the following steps: after surface texturing on a silicon wafer, preparing a tunnel layer at each of a front side and a rear side of the silicon wafer; then preparing a carbon doped polysilicon layer at each of the front side and the rear side of the silicon wafer by plasma enhanced chemical vapor deposition (PECVD) or low pressure chemical vapor deposition (LPCVD) using methane as a carbon source for carbon doping, wherein a content of carbon doped in the carbon doped polysilicon layer is 1% to 5%; then performing boron doping on one of the carbon doped polysilicon layer at the front side and the carbon doped polysilicon layer at the rear side, and performing phosphorous doping on the other of the carbon doped polysilicon layer at the front side and the carbon doped polysilicon layer at the rear side; then preparing a passivation layer at each of the front side and the rear side of the silicon wafer; and then printing an electrode at each of the front side and the rear side of the silicon wafer, wherein
   the methane is used as the carbon source to increase a content of H in a passivation interface to improve a passivation effect; and
   the carbon doping is performed to increase a band gap of the polysilicon layer to obtain a wide-band gap modified polysilicon, and the wide-band gap modified polysilicon is used as a passivation material at the front side and the rear side to reduce a loss from an infrared parasitic absorption, increase a cell current, and improve a solar cell efficiency.

2. The preparation method of the double-sided passivated contact cell according to claim 1, wherein the tunnel layer is an ultra-thin oxide layer.

3. The preparation method of the double-sided passivated contact cell according to claim 2, wherein the ultra-thin oxide layer is an aluminum oxide layer or a silicon dioxide layer.

4. The preparation method of the double-sided passivated contact cell according to claim 2, wherein the ultra-thin oxide layer has a thickness of 0.5 nm to 2.5 nm.

5. The preparation method of the double-sided passivated contact cell according to claim 1, wherein the passivation layer is a SiNx layer.

6. The preparation method of the double-sided passivated contact cell according to claim 1, wherein the silicon wafer is an N-type silicon wafer; the boron doping is performed on the carbon doped polysilicon layer at the front side; the phosphorous doping is performed on the carbon doped polysilicon layer at the rear side; and the double-sided passivated contact cell prepared is an N-type double-sided passivated contact cell.

* * * * *